United States Patent
Coln

(10) Patent No.: US 10,291,249 B2
(45) Date of Patent: May 14, 2019

(54) COMMON MODE REJECTION IN A RESERVOIR CAPACITOR SAR CONVERTER

(71) Applicant: Analog Devices, Inc., Norwood, MA (US)

(72) Inventor: Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/213,078

(22) Filed: Jul. 18, 2016

(65) Prior Publication Data

US 2018/0019761 A1    Jan. 18, 2018

(51) Int. Cl.
*H03M 1/12* (2006.01)
*H03M 1/46* (2006.01)
*H03M 1/06* (2006.01)

(52) U.S. Cl.
CPC ....... *H03M 1/1245* (2013.01); *H03M 1/0607* (2013.01); *H03M 1/466* (2013.01)

(58) Field of Classification Search
CPC ...... H03M 1/468; H03M 1/12; H03M 1/1245; H03M 1/466; H03M 1/002; H03M 1/38; H03M 1/804; H03M 1/00; H03M 1/1009; H03M 1/403; H03M 1/442; H03M 1/46; H03M 1/1038
USPC .............. 341/118–120, 144, 150, 155, 172
See application file for complete search history.

(56) References Cited

U.S. PATENT DOCUMENTS

| | | | |
|---|---|---|---|
| 4,940,981 A | 7/1990 | Naylor et al. |
| 4,975,700 A | 12/1990 | Tan et al. |
| 5,047,665 A | 9/1991 | Burt |
| 6,124,818 A | 9/2000 | Thomas et al. |
| 6,400,302 B1 | 6/2002 | Amazeen et al. |
| 6,448,911 B1 | 9/2002 | Somayajula |
| 6,473,021 B1 | 10/2002 | Somayajula et al. |
| 6,490,332 B1 | 12/2002 | Somayajula |

(Continued)

OTHER PUBLICATIONS

"U.S. Appl. No. 15/213,078, Preliminary Amendment dated Jun. 8, 2018", 11 pgs.

(Continued)

*Primary Examiner* — Linh V Nguyen

(74) *Attorney, Agent, or Firm* — Schwegman Lundberg & Woessner, P.A.

(57) ABSTRACT

An analog-to-digital converter (ADC) circuit comprises a first digital-to-analog (DAC) circuit and a second DAC circuit, wherein the first and second DAC circuits include weighted bit capacitors and reservoir capacitors; a sampling circuit configured to sample a differential input voltage onto the weighted bit capacitors and to sample a reference voltage onto the reservoir capacitors; a comparator circuit operatively coupled to outputs of the first and DAC circuits; and logic circuitry configured to: initiate successive bit trials of weighted bit capacitors to convert the input voltage to a digital value by comparing an output of the first DAC circuit and an output of second DAC circuit using the comparator circuit; and apply charge of the reservoir capacitors to the bit capacitors to reduce the comparator differential input voltage and reduce an error between the input common mode offset and the comparator common mode offset.

20 Claims, 11 Drawing Sheets

(56) References Cited

U.S. PATENT DOCUMENTS

| | | |
|---|---|---|
| 6,538,594 B1 | 5/2003 | Somayajula |
| 6,559,789 B1 | 5/2003 | Somayajula |
| 6,603,415 B1 | 8/2003 | Somayajula |
| 6,977,607 B2 | 12/2005 | Leung et al. |
| 7,358,809 B2 | 4/2008 | Elder |
| 7,432,844 B2 | 10/2008 | Mueck et al. |
| 7,675,452 B2 | 3/2010 | Madhavan et al. |
| 7,961,131 B2 | 6/2011 | Craninckx |
| 8,390,502 B2 | 3/2013 | Kapusta |
| 8,537,045 B2 | 9/2013 | Kapusta |
| 8,552,897 B1 | 10/2013 | Hurrell |
| 8,933,830 B1* | 1/2015 | Jeon ............... H03M 1/1071 341/110 |
| 8,981,972 B2 | 3/2015 | Shen et al. |
| 9,608,655 B1 | 3/2017 | Li et al. |
| 9,806,734 B1 | 10/2017 | Madan et al. |
| 2004/0257256 A1 | 12/2004 | Leung et al. |
| 2006/0125563 A1 | 6/2006 | Elder |
| 2008/0129573 A1 | 6/2008 | Mueck et al. |
| 2009/0273501 A1 | 11/2009 | Madhavan et al. |
| 2010/0283643 A1* | 11/2010 | Byrne ............... H03M 1/1225 341/122 |
| 2011/0032134 A1* | 2/2011 | Cho ............... H03M 1/0682 341/144 |
| 2011/0260899 A1* | 10/2011 | Snedeker ............ H03M 1/1047 341/118 |
| 2012/0154193 A1* | 6/2012 | Chang ............... H03M 1/145 341/156 |
| 2012/0154194 A1* | 6/2012 | Chang ............... H03M 1/002 341/158 |
| 2012/0274488 A1* | 11/2012 | Kapusta ............. H03M 1/0845 341/110 |
| 2012/0280841 A1* | 11/2012 | Wang ............... H03M 1/1295 341/110 |
| 2013/0249727 A1 | 9/2013 | Hurrell |
| 2014/0167995 A1* | 6/2014 | Tiew ............... H03M 3/444 341/143 |
| 2014/0197971 A1* | 7/2014 | Kuppannbatti ........ G06F 1/08 341/110 |
| 2014/0266839 A1* | 9/2014 | Cullinane .......... H03M 1/0673 341/155 |
| 2014/0266847 A1* | 9/2014 | Shen ............... H03M 1/38 341/158 |
| 2014/0296687 A1 | 10/2014 | Irazoqui et al. |
| 2015/0002321 A1* | 1/2015 | Zhou ............... H03M 1/0617 341/118 |
| 2015/0091746 A1* | 4/2015 | Wang ............... H03M 1/1245 341/161 |
| 2015/0263756 A1* | 9/2015 | Chiu ............... H03M 1/468 341/118 |
| 2016/0149586 A1* | 5/2016 | Roh ............... H03M 3/39 341/143 |
| 2016/0182078 A1* | 6/2016 | Shen ............... H03M 1/08 341/122 |
| 2016/0308550 A1* | 10/2016 | Tang ............... H03M 1/125 |
| 2018/0131384 A1 | 5/2018 | Kalathil et al. |

OTHER PUBLICATIONS

"U.S. Appl. No. 15/711,176, Notice of Allowance dated Mar. 20, 2018", 10 pgs.

"U.S. Appl. No. 15./711,176, Preliminary Amendment dated Apr. 25, 2018", 12 pgs.

"U.S. Appl. No. 15/711,176, Preliminary Amendment dated Oct. 17, 2017", 10 pgs.

* cited by examiner

COMMON MODE REJECTION IN A RESERVOIR CAPACITOR SAR CONVERTER

BACKGROUND

Successive approximation routine (SAR) analog-to-digital converters (ADCs) convert an analog input to a digital value. Typically, the analog input is held while the SAR ADC circuit converges to a solution after a number of bit trials. Some SAR ADC circuits convert a differential analog input to a digital value. A differential SAR ADC may require that the common mode of the input signal match the common mode of the SAR ADC. This can be accomplished by additional circuitry to translate the input common mode to the common mode required by the SAR ADC. However, this additional circuitry can result in additional space needed for an SAR ADC circuit, additional power consumption, and can introduce additional sources of noise in the SAR ADC. The present inventor has recognized a need for differential SAR ADCs that are more tolerant of variation in the input to the SAR ADCs.

OVERVIEW

This document relates generally to analog-to-digital converter (ADC) circuits and more particularly to SAR ADC circuits. An example ADC circuit includes a first digital-to-analog (DAC) circuit and a second DAC circuit, wherein the first and second DAC circuits include weighted bit capacitors and reservoir capacitors; a sampling circuit configured to sample a differential input voltage onto the weighted bit capacitors, and sample a reference voltage onto the reservoir capacitors; a comparator circuit operatively coupled to an output of the first DAC circuit and an output of the second DAC circuit to receive a comparator differential input voltage, wherein the comparator circuit has a comparator common mode offset and the comparator differential input voltage has an input common mode offset; and logic circuitry configured to: initiate successive bit trials using the weighted bit capacitors to convert the input voltage to a digital value by comparing an output of the first DAC circuit and an output of the second DAC circuit using the comparator circuit; and apply charge of the reservoir capacitors to the bit capacitors to reduce the comparator differential input voltage and reduce the discrepancy between the input common mode offset and the comparator common mode offset. The sampled differential input voltage and the error in the input common mode offset and the comparator common mode offset can be reduced simultaneously.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
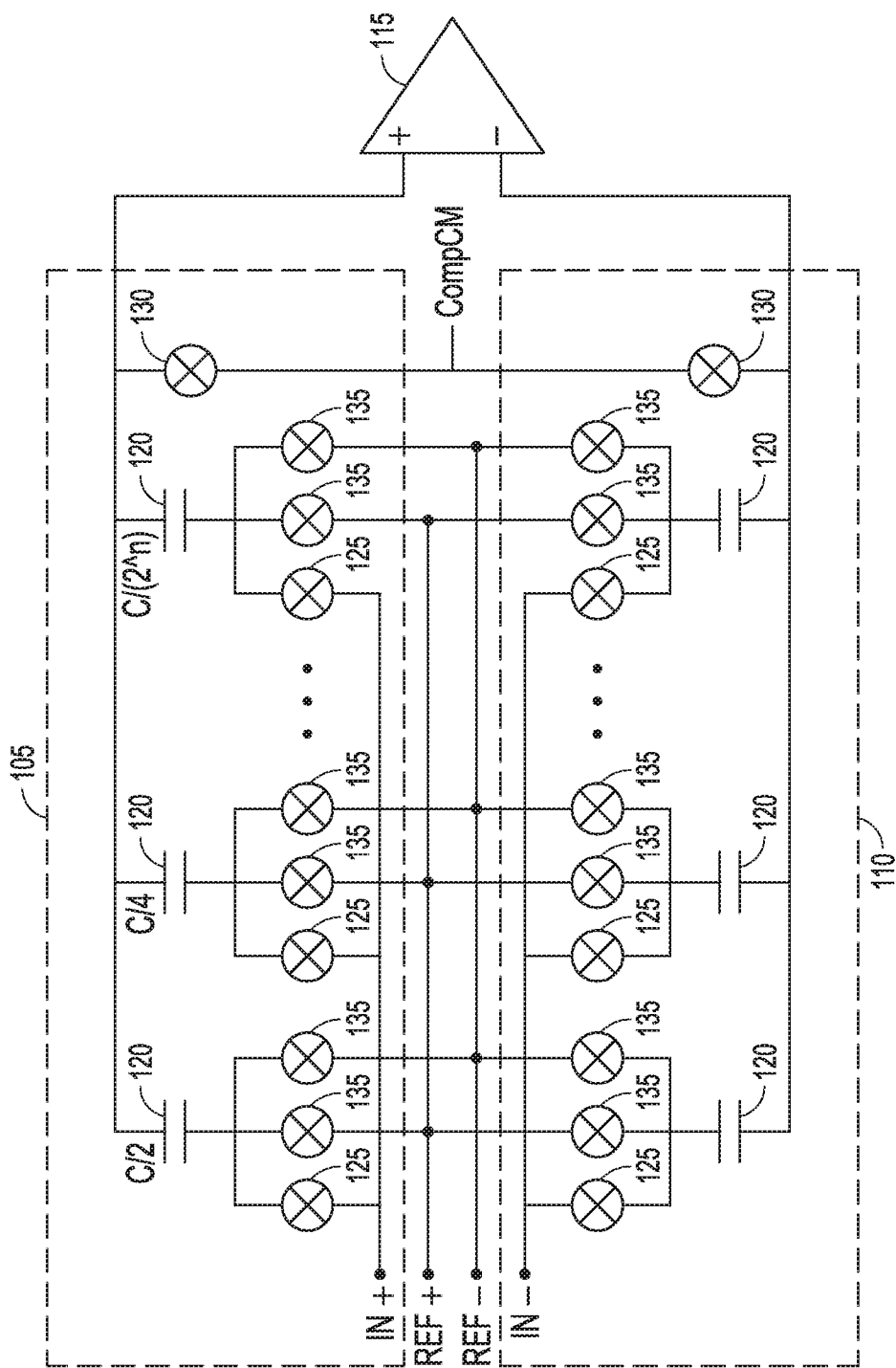
FIG. 1 is a functional block diagram of an example of a differential successive approximation routine analog-to-digital converter (SAR ADC).

FIG. 1 is a functional block diagram of an example of a differential SAR ADC. The SAR ADC 100 includes a positive digital-to-analog converter (DAC) 105, a negative DAC 110, and a comparator circuit 115. Each DAC includes weighted bit capacitors 120. In the example, the capacitors are weighted as $C/2, C/4 \ldots C/(2^N)$, where N is the number of bits in the DACs and C is the total capacitance of the bit capacitors added together. A differential analog input voltage (IN+, IN−) is sampled onto the bit capacitors with respect to the common mode of the comparator (CompCM) by closing switches 125 and 130. The input voltage is held on the capacitors by opening switches 130, then opening switches 125. The top plates of the capacitors are at the CompCM voltage.

The positive DAC 105 and the negative DAC 110 are also connected to positive and negative reference voltage (REF+, REF−). As part of the successive approximation routine, bit trials for each of the bit capacitors are performed iteratively. In a bit trial, the output of the positive DAC 105 and the output of the negative DAC 110 are applied to the inputs of the comparator circuit 115. Based on the output of the comparator circuit, a bit capacitor is connected to either REF+ or REF− using switches 135. If the bit capacitor is connected to REF+ the bit of the digital value corresponding to the bit capacitors is assigned a logic value '1', and if the bit capacitor is connected to REF+the bit of the digital value corresponding to the bit capacitors is assigned a logic value '0'. Conversion then proceeds to the next bit capacitor until all bits of the digital value are determined.

Figure 2:
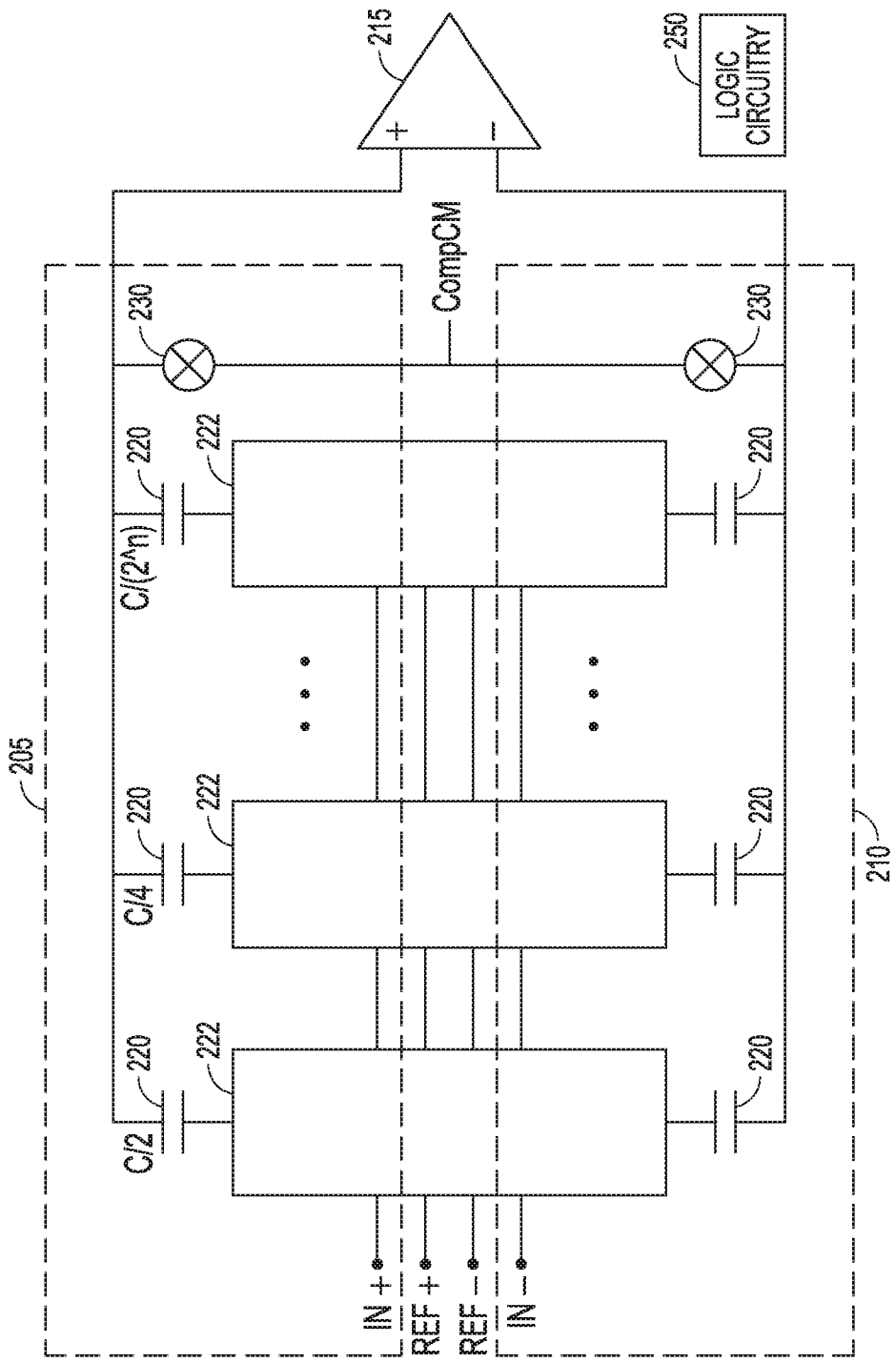
FIG. 2 is a functional block diagram of an example of a reservoir-capacitor SAR ADC.

FIG. 2 is a functional block diagram of portions of an example of a reservoir-capacitor SAR ADC 200. Similar to the SAR ADC of FIG. 1, the reservoir-capacitor SAR ADC 200 includes two DACs, a positive DAC 205 and a negative DAC 210, and a comparator circuit 215. Each DAC includes weighted bit capacitors 220 shown attached to circuit blocks 222 to simplify the Figure. Some examples of the DACs include 8, 12, or 16 bit DACs. There is a circuit block for each bit weight $(C/2, C/4 \ldots C/(2^N))$ and a circuit block includes an arrangement of electronic switches and a reservoir capacitor.

Figure 3:
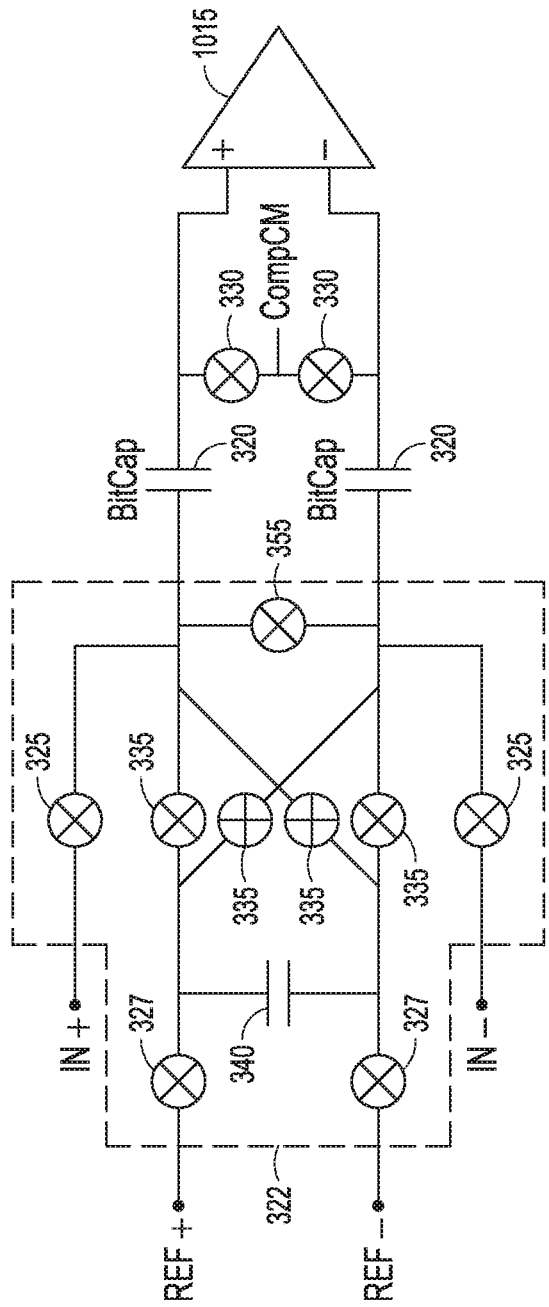
FIG. 3 is a circuit diagram of an example of a circuit block of the reservoir-capacitor SAR ADC of FIG. 2.

FIG. 3 is circuit diagram showing an example of the circuit block 222 of FIG. 2, and shows the example circuit block 322 coupled to the differential input voltage, differential reference voltage, and comparator circuit 315. The circuit block 322 includes a reservoir capacitor 340. The value of capacitance of a reservoir capacitor may be larger than the capacitance value of its corresponding bit capacitor. The value of capacitance of a reservoir capacitor may be five to twenty times the capacitance of the bit capacitors.

The differential analog input voltage (IN+, IN−) is sampled and stored onto the bit capacitors with respect to the comparator common mode using switches 325 and 330. The reference voltage can be sampled on the reservoir capacitor 340 at the same time as the input voltage is sampled on the bit capacitors 320 using switches 327. Switches 335 isolate the reservoir capacitor from the bit capacitors during the sampling. Switches 325, 327, 330, and 335 are open and switch 355 is closed for a bit trial. Depending on the result of the bit trial at the comparator output, the voltage of the reservoir capacitor 340 is added or subtracted from the voltage of the bit capacitors 320. The bit of the digital value corresponding to the trial is set to a logical '1' or '0' depending on the comparator result and therefore whether the voltage of the reservoir capacitor 340 is added or subtracted from the bit capacitors using switches 335.

Returning to FIG. 2, the reservoir-capacitor SAR ADC 200 includes logic circuitry 250. In certain examples, the logic circuitry 250 is included in an SAR ADC controller. In certain examples, the logic circuitry 250 includes a sequencer to advance the SAR ADC 200 through multiple circuit states to perform the SAR. The logic circuitry 250 progresses the conversion of the differential analog input signal through all of the bit capacitors until all bits of the digital value are determined. In certain examples, the logic circuitry includes an SAR controller (e.g., a processor) that progresses the SAR ADC through a conversion according to outcomes determined at the comparator circuit 215. In certain examples, the logic circuitry includes a logic sequencer that progresses the conversion through a series of logic states that correspond to steps of the bit trials. Using the reservoir capacitors speeds up the bit trials from the embodiment of FIG. 1 because resampling does not need to take place during every bit trial.

The differential SAR ADCs of FIG. 1 and FIG. 2 may require that the common mode of the input signal match the comparator common mode CompCM. If the input common mode matches the comparator common mode, the voltage at the top plate of the bit capacitors 220 (i.e., the plate connected to the comparator) of the positive DAC 205 and the negative DAC 210 will converge to the comparator common mode voltage by the end of the bit trials. At the end of the conversion, the bits of negative DAC are the inverse of the bits of the positive DAC. If the input common mode does not match the comparator common mode, the bit capacitors of the positive DAC 205 and the negative DAC 210 will not converge to the comparator common mode voltage. If the mismatch is large enough, there will be an offset that may cause errors in the digital conversion. As explained above, matching the common modes may require additional circuit components. Therefore, it is desirable for a SAR ADC structure that accommodates differences between the input common mode and the comparator common mode.

Figure 4:
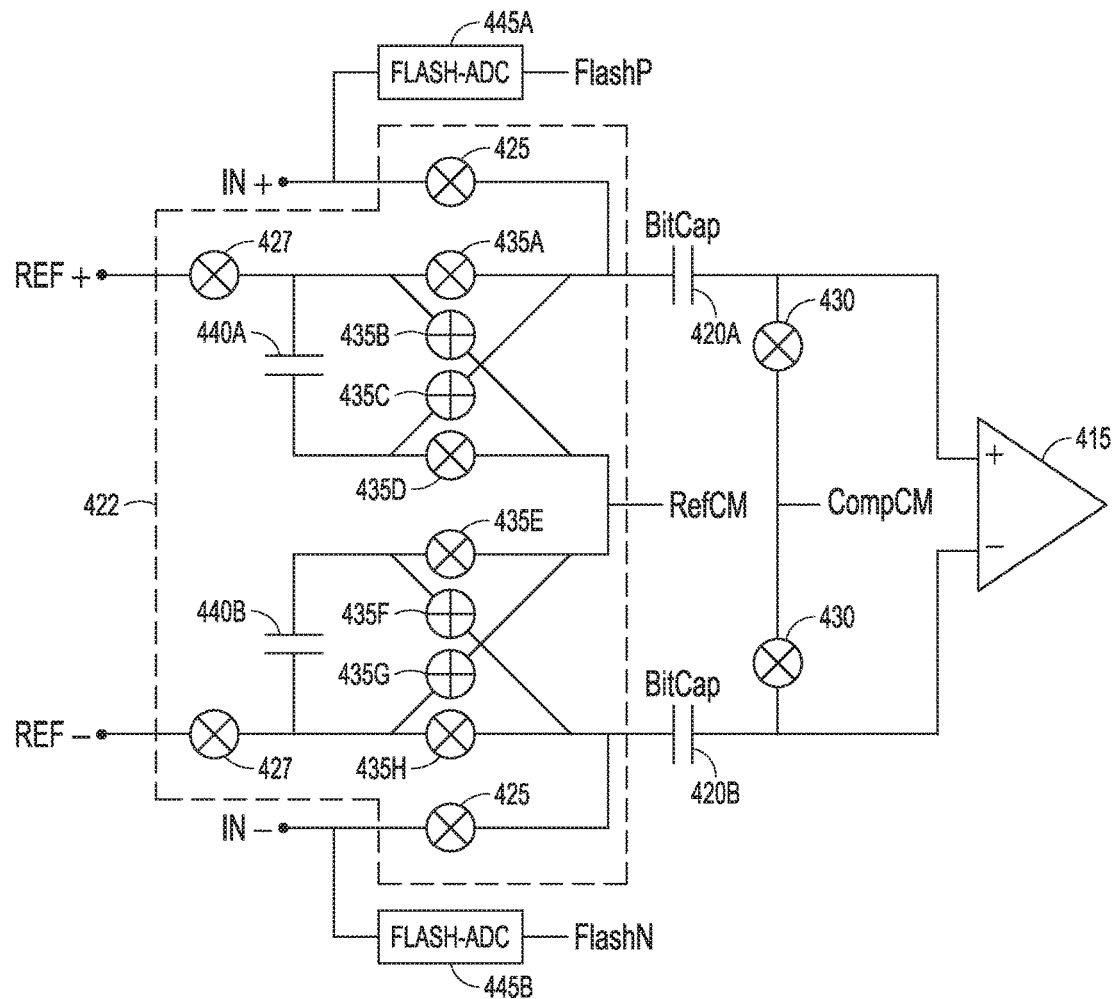
FIG. 4 is a circuit diagram of another example of a circuit block of the reservoir-capacitor SAR ADC of FIG. 2.

FIG. 4 is a circuit diagram of another example of the circuit block 222 for the differential reservoir-capacitor SAR ADC of FIG. 2. As shown in FIG. 2, there is a circuit block for each bit weight of the ADC, and the circuit blocks are electrically coupled to the weighted bit capacitors 420A and 420B of the positive DAC and the negative DAC. The circuit block 422 includes two reservoir capacitors 440A and 440B attached to the positive reference REF+ and the negative reference REF−, respectively. In certain embodiments, the reservoir capacitors 440A and 440B of FIG. 4 have twice the capacitance of the reservoir capacitors of the embodiment of FIG. 3. The circuit blocks include a sampling circuit that includes switches 425, 427, 430, 435D, and 435E.

Figure 5:
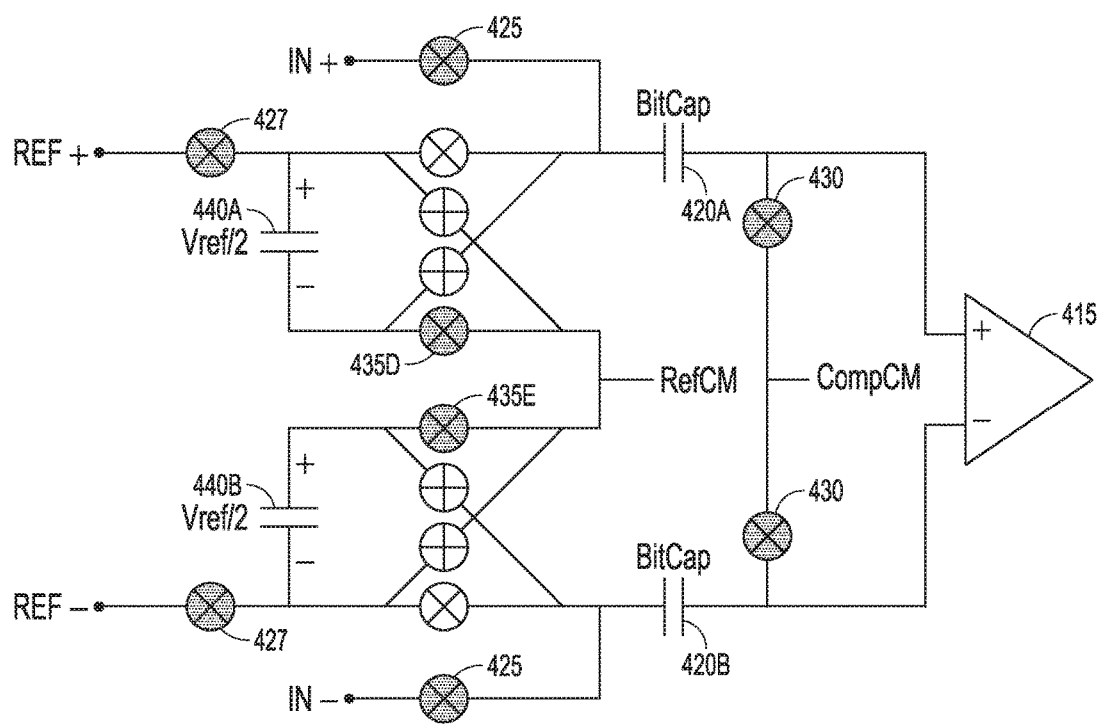
FIG. 5 is a circuit diagram showing the sampling phase and reservoir capacitor refresh phase of the circuit block example of FIG. 4.

FIG. 5 is the circuit diagram of FIG. 4 showing the sampling phase and reservoir capacitor refresh phase of the circuit blocks. The active switches during the phases are shown darkened. The differential input voltage (IN+, IN−) is sampled onto the bit capacitors 420A and 420B with respect to the comparator common mode CompCM using switches 425 and 430. The reference voltage is sampled onto the reservoir capacitors 440A and 440B with respect to a reference common mode (RefCM) using switches 427 and 435D, 435E. One half of the differential reference voltage (Vref) is sampled onto the reservoir capacitors. The reference voltage can be sampled onto the reservoir capacitors at the same time as the differential input voltage is sampled onto the bit capacitors 420A and 420B. The bit capacitors of the DACs store the input signal as sampled charge and deliver a differential input voltage to the comparator inputs. This comparator differential input voltage represents the imperfection between the original input signal and an estimate of the input signal developed by the DACS. The comparator differential input voltage includes an input common mode offset, and the comparator circuit 415 has a comparator common mode offset.

The logic circuitry 250 of FIG. 2 is coupled to positive and negative DAC circuits, the switches, and the comparator circuit. As part of a successive approximation routine, the logic circuitry 250 initiates successive bit trials using the weighted bit capacitors to convert the input voltage to a digital value by comparing the outputs of the positive DAC circuit and the negative DAC circuit using the comparator circuit and updating the DAC values. As the conversion progresses, the comparator differential input voltage is reduced towards zero by transferring charge from the reference reservoir capacitors to the bit capacitors. This converges the estimate of the input signal on the DACs to the original input signal. The logic circuitry 250 also applies a correction voltage to one or more of the bit trials using the reservoir capacitors to reduce a difference between the input common mode offset and the comparator common mode offset. This will cause the offset of the input common mode to converge toward the common mode of the comparator. The comparator differential input voltage can be reduced simultaneously with reducing the error between the input common mode offset and the comparator common mode offset.

The correction voltage can be applied using the reservoir capacitors. The logic circuitry 250 can initiate a comparison of the output of the positive DAC 205, the output of the negative DAC 210, and the common mode voltage of the comparator circuit 215. Charge of the reservoir capacitor is applied to a weighted bit capacitor based upon the bit trials based on the outcome of the comparison.

In some examples, an auxiliary ADC is used in the comparison of the output of the positive DAC, the output of the negative DAC, and the common mode voltage of the comparator circuit. In the example of FIG. 4, the auxiliary ADC is a Flash ADC. A Flash ADC is sometimes referred to as a direct-conversion ADC. In contrast to a SAR ADC, the result of the Flash ADC is available after one cycle of conversion. In the example of FIG. 4, there is a first Flash ADC 445A to convert a voltage referenced from the input of the positive DAC circuit to the comparator common mode, and a second Flash ADC 445B to convert a voltage referenced from the input of the negative DAC input to the comparator common mode. One bit of the Flash ADCs are represented in FIG. 4, and the outputs are designated FlashP and FlashN.

There are four possible outcomes to the conversion of the input by the Flash ADCs. These four outcomes are included in the truth table below. In Case Nos. 1 and 2 the Auxiliary ADCs for the bit position have different outcomes. For these cases there is no input common mode issue because the input voltage is intermediate the output voltage of the positive DAC circuit and the negative DAC circuit.

TABLE 1

| Case No. | FlashP | FlashN |
|---|---|---|
| 1 | 1 | 0 |
| 2 | 0 | 1 |
| 3 | 1 | 1 |
| 4 | 0 | 0 |

For Case No. 1, there is a positive differential voltage residue on the bit capacitors 420A and 420B. For Case No. 2, there is a negative differential voltage residue on the bit capacitors 420A and 420B. For case No. 3, both the input at the positive side and the input at the negative side are greater than the comparator common mode. Thus, the input voltage has a common mode different from the comparator common mode and there is a positive input common mode residue voltage on the bit capacitors 420A and 420B. For case No. 4, both the input at the positive side and the input at the negative side are less than the comparator common mode. Thus, there is a negative input common mode residue voltage on the bit capacitors 420A and 420B.

Figure 6:
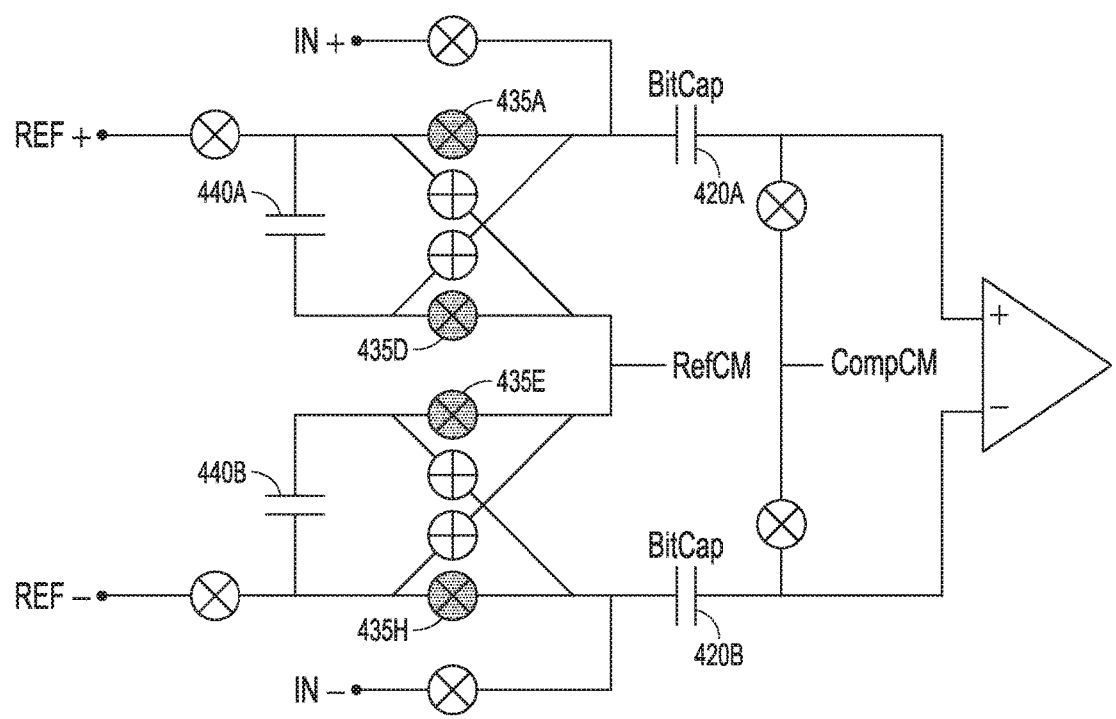
FIGS. 6-9 are circuit diagrams showing the switching activation of the circuit block example of FIG. 4.
Figure 7:
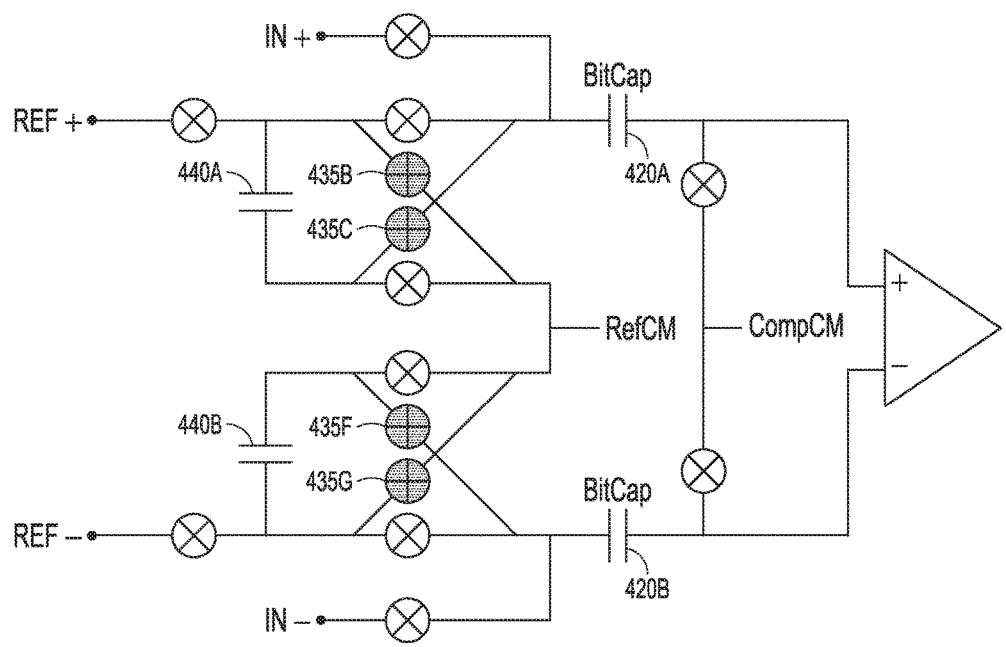

FIGS. 6-9 are circuit diagrams of the circuit block of FIG. 4 showing the switching activation to add or subtract the charge of the reservoir capacitors to the weighted bit capacitors for the four cases in Table 1. In FIG. 6, switches 435A, 435D, 435E, and 435H shown darkened in the Figure are the activated switches when the result of the auxiliary ADCs corresponds to Case No. 1. The reservoir capacitors 440A and 440B are applied to the bit capacitors 420A and 420B without inversion of the charge on either of the reservoir capacitors. In FIG. 7, switches 435B, 435C, 435F, and 435G are the activated switches when the result of the auxiliary ADCs corresponds to Case No. 2. The charge on both of the reservoir capacitors 440A and 440B is inverted and applied to the bit capacitors 420A and 420B. For both Case Nos. 1 and 2, applying the reservoir capacitors to the bit capacitors using the configuration of FIG. 6 or FIG. 7 converges the differential input voltage towards zero.

Figure 8:
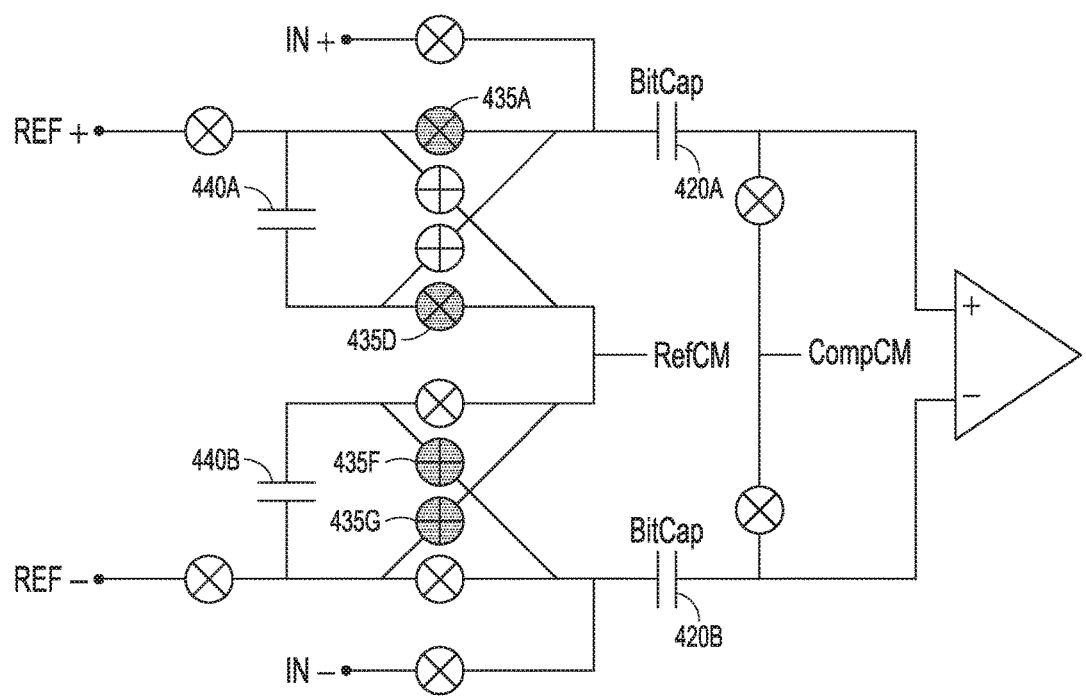

FIG. 8 shows the switch activation when the result of the auxiliary ADCs corresponds to Case No. 3. Switches 435A, 435D, 435F, and 435G are the activated switches. As explained previously herein, when the outputs of the auxiliary ADC are both '1s', both the input at the positive side and the input at the negative side are greater than the comparator common mode CompCM because of the positive common mode residue. A correction voltage is applied to the bit capacitors based upon the bit trial. The charge on reservoir capacitor 440B is inverted and applied to bit capacitor 420B. The charge on reservoir capacitor 440A is applied to bit capacitor 420B without inverting.

Figure 9:
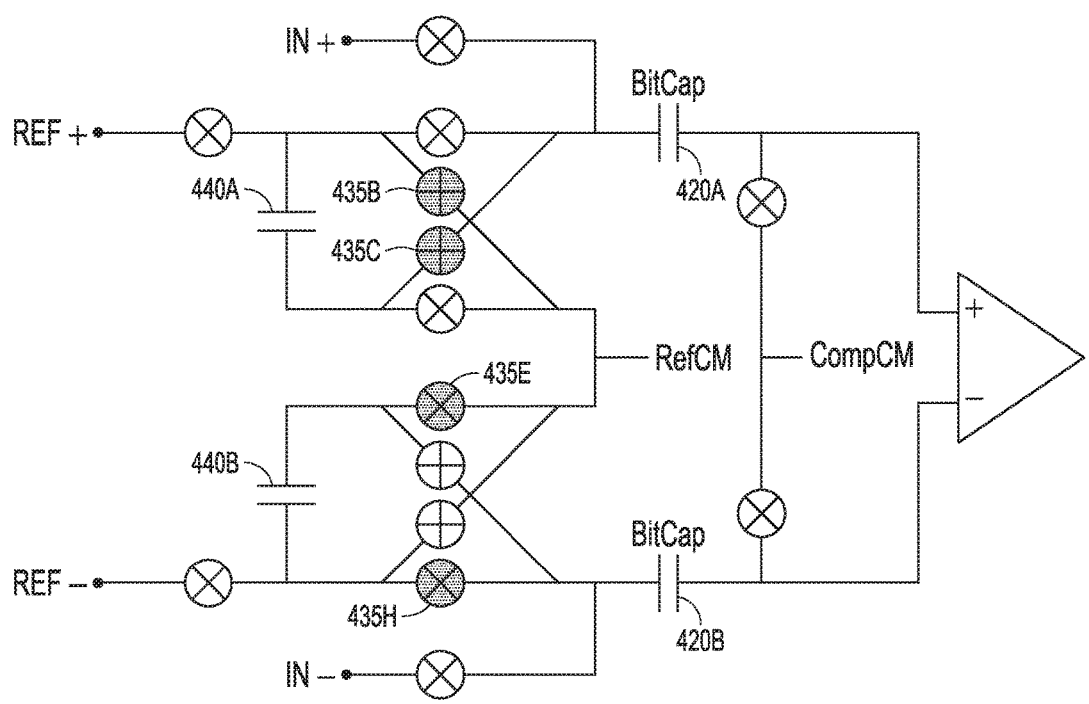

FIG. 9 shows the switch activation when the result of the auxiliary ADCs corresponds to Case No. 4. Switches 435B, 435C, 435E, and 435H are the activated switches. As explained previously herein, when the outputs of the auxiliary ADC are both '0s', both the input at the positive side and the input at the negative side are less than the comparator common mode CompCM because of the negative common mode residue. A correction voltage is applied to the bit capacitors based upon the bit trial. The charge on reservoir capacitor 440A is inverted and applied to bit capacitor 420A. The charge on reservoir capacitor 440B is applied to bit capacitor 420B without inverting. For both Case Nos. 3 and 4, applying the reservoir capacitors to the bit capacitors using the configuration of FIG. 8 or FIG. 9 converges the common mode offset of the input signal towards the comparator common mode offset.

As the bit trials progress, the sampled differential input voltage converges to zero volts. The difference between the comparator common mode offset and the input common mode offset also converges toward zero volts. The difference between the comparator common mode offset and the input common mode offset is more of an issue for the most significant bits (MSBs) of the DACs which are processed first and the difference in common mode is greatly reduced for the least significant bits (LSBs).

For instance, the DAC circuits 205 and 210 in FIG. 2 may be N-bit DAC circuits, N being a positive integer (e.g., N=12 or N=16). The logic circuitry 250 may initiate the comparison using the output of the first DAC circuit, the output of the second DAC circuit, and a common mode voltage of the first comparator circuit for bit trials for only k most significant bits (MSBs) of the N-bit DAC circuits, k being a positive integer less than N (e.g., k=3, 4, or 5) and applying the correction voltage to the k MSBs according to the comparison. This can reduce the overall conversion time.

Although the process of correcting for common mode mismatch has been described in terms of one bit of a DAC at a time, the common mode estimation may be performed for several bits of the DAC at the same time. And the correction could be applied to several bits at the same time. Thus, the correction may be applied to bit capacitor array of the first DAC and a bit capacitor array of the second DAC, where a capacitor array includes one or more bit capacitors.

Because of the arrangement of the electronic switches in the circuit blocks as shown in FIG. 4, the two DACS may be processed independently. The switches isolate the voltages on the reservoir capacitors and bit capacitors. In some examples, the logic circuitry 250 of FIG. 2 initiates a comparison of the output of the first DAC circuit and the output of the second DAC circuit. The logic circuitry 250 adds or subtracts charge from a weighted reservoir capacitor of the first DAC circuit to a corresponding weighted bit capacitor of the first DAC circuit according to the comparison, and independently adds or subtract charge from a weighted reservoir capacitor of the second DAC circuit to a corresponding weighted bit capacitor of the second DAC circuit according to the comparison.

Figure 10:
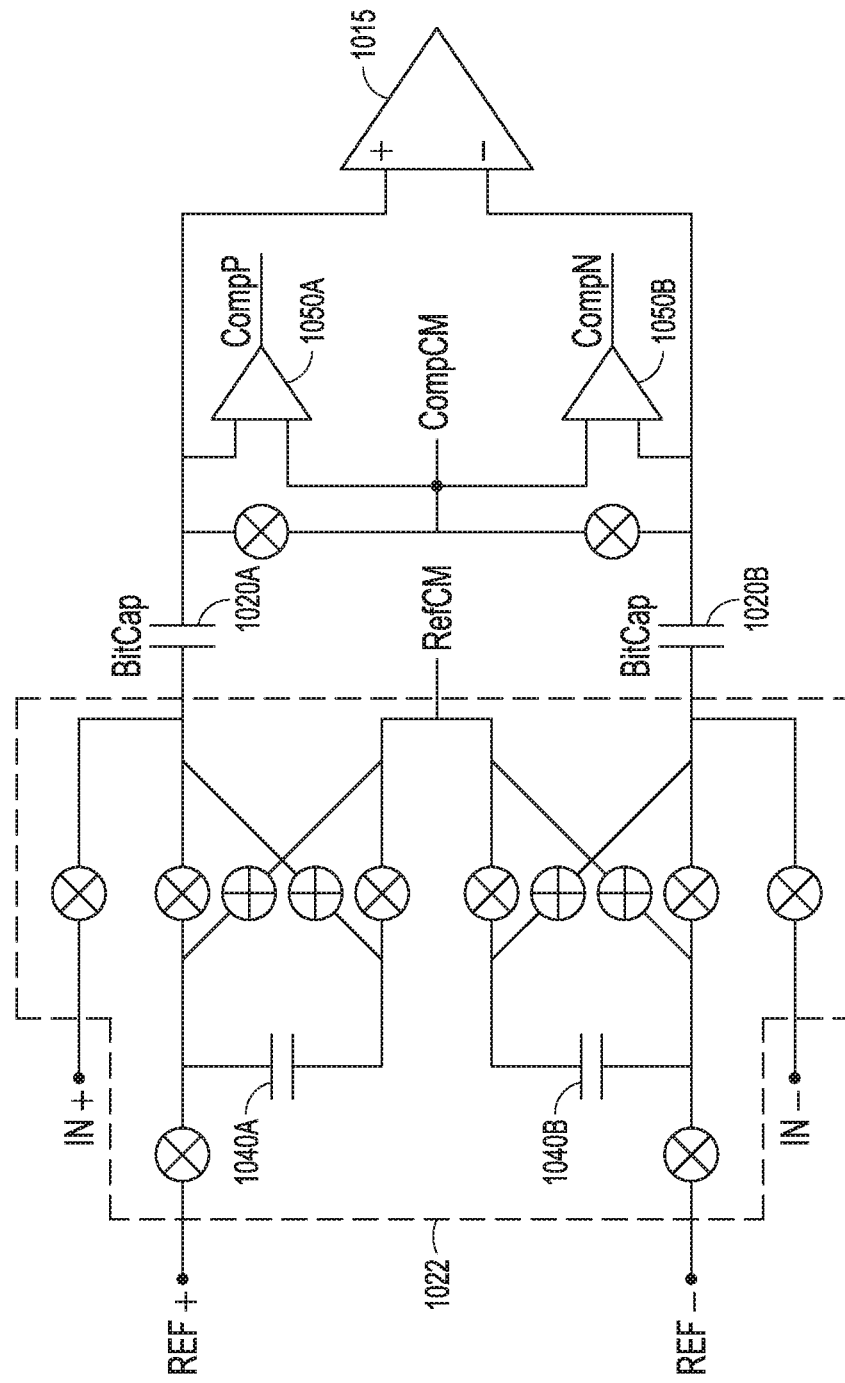
FIG. 10 is a circuit diagram of another example of a circuit block of the reservoir-capacitor SAR ADC of FIG. 2.

FIG. 10 is a circuit diagram of another embodiment of the circuit block 222 for the differential reservoir-capacitor SAR ADC of FIG. 2. As in FIG. 4, the circuit block 1022 includes two reservoir capacitors 1040A and 1040B; attached to the positive reference REF+ and the negative reference REF−, respectively. In certain embodiments, the reservoir capacitors 1040A and 1040B of FIG. 4 have twice the capacitance of the reservoir capacitors of the embodiment of FIG. 3. Instead of using auxiliary flash ADCs as in FIG. 4, additional comparators are used. FIG. 10 shows the main comparator circuit 1015 used for bit trails of the bit capacitors. The circuit of FIG. 10 includes a second comparator circuit 1050A that receives the input voltage from the first DAC circuit and the comparator common mode voltage CompCM, and includes a third comparator circuit 1050B that receives the input voltage from the second DAC circuit and the comparator common mode voltage. Similar to the auxiliary ADC approach, there are four possible outcomes of the comparisons using the two additional comparators. The outcomes are the same in Table 1, but with comparator output CompP replacing FlashP and comparator output CompN replacing FlashN.

The logic circuitry 250 in FIG. 2 applies charge of reservoir capacitor 1040A (or reservoir capacitor array) to bit capacitor 1020A (or bit capacitor array) and applies charge of reservoir capacitor 1040B to bit capacitor 1020B according to the outputs CompP and CompN.

Figure 11:
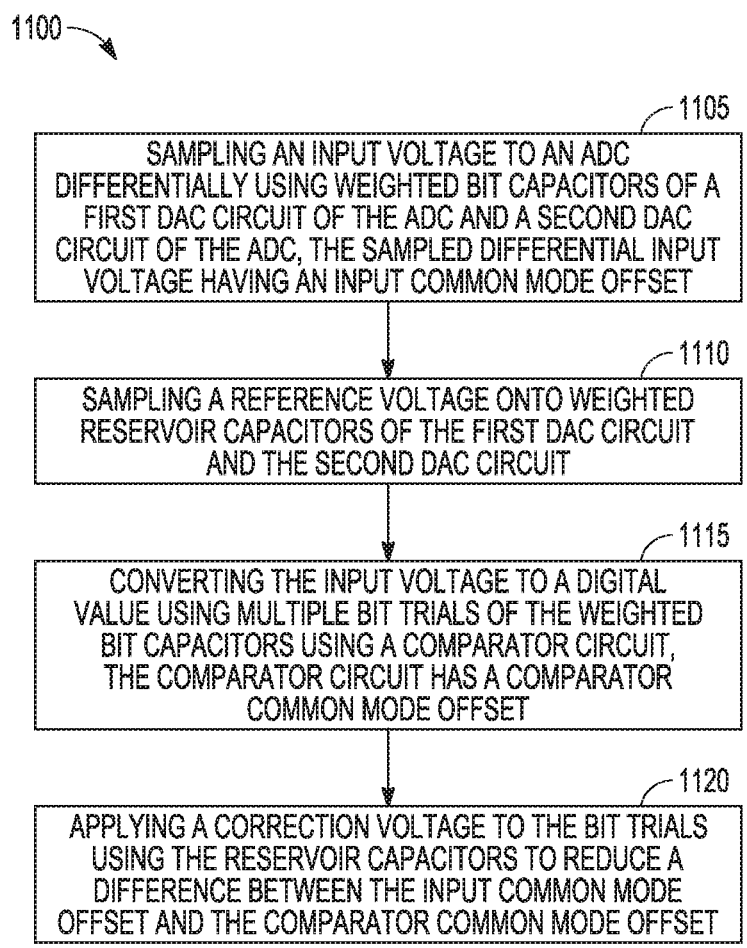
FIG. 11 is a flow diagram of an example of a method of operating an ADC circuit.

FIG. 11 is a flow diagram of a method 1100 of operating an ADC circuit to convert an analog input voltage to a digital value. At 1105, an input voltage is sampled onto the ADC differentially. The differential input voltage is sampled using weighted bit capacitors of a first (e.g., positive) DAC circuit of the ADC and a second (e.g., negative) DAC circuit of the ADC. The bit capacitors of the DACs store the input signal as sampled charge and deliver a comparator differential input voltage to the comparator inputs. The comparator differential input voltage has an input common mode offset voltage.

At 1110, a reference voltage is sampled onto weighted reservoir capacitors of the first DAC circuit and the second DAC circuit. At 1115, the input voltage is converted to a digital value using multiple bit trials of the weighted bit capacitors. A bit trial determines a bit value of the digital value by comparing the output of the first DAC circuit and the output of the second DAC circuit using a comparator circuit. The results of bit trials using the first DAC can be stored in a first successive approximation routine register (SAR register) and the results of bit trials using the second DAC can be stored in a second SAR register. The comparator differential input voltage is reduced towards zero during the bit trials.

The comparator circuit has a comparator common mode offset voltage. At 1120, for one or more of the bit trials charge from reservoir capacitors is applied to bit capacitors to reduce a difference between the input common mode offset and the comparator common mode offset. Any error between the differential input common mode and the comparator common mode can be reduced simultaneously with the reduction of the comparator differential input voltage.

The ADC circuits described herein can be used in an electronic data acquisition system, such as to acquire data from one or more sensors. The differential input to an ADC circuit can be electrically coupled to a buffer between the sensor and the ADC input to provide high impedance interface if necessary. The ADC circuits described tolerate differences in a common mode of the sensor output voltage and a common mode of the ADC circuit without adding additional instrumentation circuits.

ADDITIONAL DESCRIPTION AND EXAMPLES

Example 1 includes subject matter (such as an analog-to-digital converter (ADC) circuit) comprising: a first digital-to-analog (DAC) circuit and a second DAC circuit, wherein the first and second DAC circuits include weighted bit capacitors and reservoir capacitors; a sampling circuit configured to sample a differential input voltage onto the weighted bit capacitors, and sample a reference voltage onto the reservoir capacitors; a first comparator circuit operatively coupled to an output of the first DAC circuit and an output of the second DAC circuit to receive a comparator differential input voltage, wherein the first comparator circuit has a comparator common mode offset and the comparator differential input voltage has an input common mode offset; and logic circuitry coupled to the first and second DAC circuits, the sampling circuit, and the first comparator circuit, the logic circuitry configured to: initiate successive bit trials using the weighted bit capacitors to convert the input voltage to a digital value by comparing an output of the first DAC circuit and an output of the second DAC circuit using the first comparator circuit; and apply charge of the reservoir capacitors to the bit capacitors to reduce the comparator differential input voltage and reduce an error between the input common mode offset and the comparator common mode offset.

In Example 2, the subject matter of Example 1 optionally includes logic circuitry configured to initiate a comparison using the output of the first DAC circuit, the output of the second DAC circuit, and a common mode voltage of the first comparator circuit; and apply charge of a reservoir capacitor to a weighted bit capacitor based upon the one or more of the bit trials according to the comparison.

In Example 3, the subject matter of one or both of Examples 1 and 2 optionally includes a first auxiliary ADC circuit configured to convert a voltage referenced from an input of the first DAC circuit to the comparator common mode, and a second auxiliary ADC circuit configured to convert a voltage referenced from an input of the second DAC circuit to the comparator common mode; wherein the logic circuitry is configured to apply charge of a first reservoir capacitor array of the first DAC circuit to a first bit capacitor array of the first DAC circuit according to an output of the first auxiliary DAC, and apply charge of a second reservoir capacitor array of the second DAC circuit to a second bit capacitor array of the second DAC circuit according to an output of the second auxiliary DAC.

In Example 4, the subject matter of one or any combination of Examples 1-3 optionally includes a second comparator circuit configured to receive an input voltage from the first DAC circuit and the comparator common mode, and a third comparator circuit configured to receive an input voltage from the second DAC circuit and the comparator common mode; wherein the logic circuitry is configured to apply charge of a first reservoir capacitor array of the first DAC circuit to a first bit capacitor array of the first DAC and apply charge of a second reservoir capacitor array of the second DAC circuit to a second bit capacitor array of the second DAC circuit according to output of the second and third comparator circuits.

In Example 5, the subject matter of one or any combination of Examples 1-4 optionally includes first and second DAC circuits that are N-bit DAC circuits, N being a positive integer, and wherein the logic circuitry is configured to initiate the comparison using the output of the first DAC circuit, the output of the second DAC circuit, and a common mode of the first comparator circuit based upon bit trials for k most significant bits (MSBs) of the N-bit DAC circuits, k being a positive integer greater than zero and less than N, and applying the correction voltage to the k MSBs according to the comparison.

In Example 6, the subject matter of one or any combination of Examples 1-5 optionally includes logic circuitry configured to modify charge of a weighted bit capacitor of the first DAC circuit using a corresponding weighted reservoir capacitor of the first DAC circuit according to the comparison, and independently modify charge of a weighted bit capacitor of the second DAC circuit using a corresponding weighted reservoir capacitor of the second DAC circuit according to the comparison.

In Example 7, the subject matter of one or any combination of Examples 1-6 optionally includes switching circuitry operatively coupled to the reservoir capacitor and the weighted bit capacitor, and configured to apply one of the charge of the reservoir capacitor or an inverse of the charge of the reservoir capacitor to the weighted bit capacitor based upon the one or more of the bit trials according to the comparison.

In Example 8, the subject matter of one or any combination of Examples 1-7 optionally includes logic circuitry configured to: apply a positive voltage from a reservoir capacitor of the first DAC circuit to a corresponding weighted bit capacitor of the first DAC circuit and a positive voltage from a reservoir capacitor of the second DAC circuit to a corresponding weighted bit capacitor of the second DAC circuit when the comparison indicates that the outputs of both the first and second DAC circuits are less than the comparator common mode; and apply a negative voltage from the reservoir capacitor of the first DAC circuit to the corresponding weighted bit capacitor of the first DAC circuit and a negative voltage from the reservoir capacitor of the second DAC circuit to the corresponding weighted bit capacitor of the second DAC circuit when the comparison indicates that the outputs of both the first and second DAC circuits are greater than the comparator common mode.

In Example 9, the subject matter of one or any combination of Examples 1-8 optionally includes logic circuitry configured to: apply a positive voltage from a reservoir capacitor of the first DAC circuit to a corresponding weighted bit capacitor of the first DAC circuit and a negative voltage from a reservoir capacitor of the second DAC circuit to a corresponding weighted bit capacitor of the second DAC circuit when the comparison indicates that the output of the first DAC circuit is greater than the comparator common mode voltage and the output of the second DAC circuit is less than the comparator common mode; and apply a negative voltage from the reservoir capacitor of the first DAC circuit to the corresponding weighted bit capacitor of the first DAC circuit and a positive voltage from the reservoir capacitor of the second DAC circuit to the corresponding weighted bit capacitor of the second DAC circuit when the comparison indicates that the output of the first DAC circuit is less than the comparator common mode voltage and the output of the second DAC circuit is greater than the comparator common mode.

In Example 10, the subject matter of one or any combination of Examples 1-9 optionally includes logic circuitry configured to perform bit trials for the first DAC circuit and the second DAC circuit independently to simultaneously reduce the comparator differential input voltage to zero and converge a difference between the input common mode offset and the comparator common mode offset to zero.

Example 11 includes subject matter (such as a method of operating an ambulatory medical device, a means for performing acts, or a machine-readable medium including instructions that, when performed by the machine, cause the machine to perform acts), or can optionally be combined with the subject matter of one or any combination of Examples 1-14 to include such subject matter, comprising: sampling an input voltage onto the ADC differentially using weighted bit capacitors of a first digital-to-analog converter (DAC) circuit of the ADC and a second DAC circuit of the ADC and applying a differential input voltage to a first comparator circuit; sampling a reference voltage onto weighted reservoir capacitors of the first DAC circuit and the second DAC circuit; converting the input voltage to a digital value using multiple bit trials of the weighted bit capacitors, wherein a bit trial of the multiple bit trials determines a bit value of the digital value by comparing an output of the first DAC circuit and an output of the second DAC circuit using the first comparator circuit, wherein the first comparator circuit has a comparator common mode offset and the differential input voltage applied to the comparator has an input common mode offset; and applying charge of one or more reservoir capacitors to one or more bit capacitors to reduce the comparator differential input voltage and reduce an error between the input common mode offset and the comparator common mode offset.

In Example 12, the subject matter of Example 11 optionally includes applying the correction voltage includes comparing the output of the first DAC circuit, the output of the second DAC circuit, and a common mode voltage of the first comparator circuit, and applying the correction voltage from a reservoir capacitor to a weighted bit capacitor according to the comparison.

In Example 13, the subject matter of one or both of Examples 11 and 12 optionally includes sampling the input voltage differentially from an input of the first DAC circuit to an input of the second DAC circuit; applying the input of the first DAC circuit to a first auxiliary ADC circuit, and applying the input of the second DAC circuit to a second auxiliary ADC circuit; comparing the output of the first auxiliary ADC circuit, the output of the second auxiliary ADC circuit, and the common mode of the first comparator circuit; and applying charge from a first reservoir capacitor array of the first DAC circuit to a first bit capacitor array of the first DAC circuit according to the comparison, and applying charge from a second reservoir capacitor array of the second DAC circuit to a second bit capacitor array of the second DAC circuit according to the comparison.

In Example 14, the subject matter of one or any combination of Examples 11-13 optionally includes comparing an output of the first DAC to the common mode offset using a second comparator circuit and comparing an output of the second DAC circuit to the common mode offset using a third comparator circuit, and applying charge from a first reservoir capacitor array of the first DAC circuit to a first bit capacitor array of the first DAC circuit and applying charge from a second reservoir capacitor array of the second DAC circuit to a second bit capacitor array of the second DAC circuit according to outputs of the second and third comparator circuits.

In Example 15, the subject matter of one or any combination of Examples 11-14 optionally includes first and second DAC circuits that are N-bit DAC circuits, N being a positive integer greater than one, and wherein applying the correction voltage includes comparing the output of the first DAC circuit, the output of the second DAC circuit, and the common mode voltage of the first comparator circuit based upon bit trials for k most significant bits (MSBs) of the N-bit DAC circuits, k being a positive integer less than N. and applying the correction voltage to the k MSBs according to the comparison.

In Example 16, the subject matter of one or any combination of Examples 11-15 optionally includes modifying charge stored on a weighted bit capacitor of the first DAC circuit using a corresponding weighted reservoir capacitor of the first DAC circuit according to the comparison, and independently modifying charge stored on a weighted bit capacitor of the second DAC circuit to a corresponding weighted reservoir capacitor of the second DAC circuit according to the comparison.

In Example 17, the subject matter of one or any combination of Examples 11-16 optionally includes operating the first DAC circuit and the second DAC circuit independently to simultaneously converge the comparator differential input voltage to zero and converge the input common-mode offset to the comparator common mode offset.

Example 18 includes subject matter (such as a differential successive approximation routine analog-to-digital converter (SAR ADC) circuit), or can be combined with one or any combination of Examples 1-17 to include such subject matter comprising: a first DAC circuit and a second DAC circuit, wherein the first and second DAC circuits include weighted bit capacitors configured to store a sampled differential input voltage and reservoir capacitors to store a sampled differential reference voltage, a comparator circuit configured to compare outputs of the first and second DAC circuits; and logic circuitry configured to: converge a differential voltage residue between outputs of the first DAC circuit and second DAC circuit towards zero volts when the input common mode voltage is intermediate the output voltage of the first DAC circuit and the output voltage of the second DAC circuit; and converge a common mode voltage residue between outputs of the first DAC circuit and second DAC circuit towards a common mode voltage of the comparator by applying charge of the reservoir capacitors to the bit capacitors when the input common mode voltage is greater than or less than both the output voltage of the first DAC circuit and the output voltage of the second DAC circuit.

In Example 19, the subject matter of Example 18 optionally includes first and second DAC circuits that are N-bit DAC circuits, wherein N is a positive integer, and wherein the logic circuitry is configured to converge the common mode voltage residue for only the k most significant bits (MSBs) of the N-bit DAC circuits, wherein k is a positive integer greater than zero and less than N.

In Example 20, the subject matter of one or both of Example 18 and 19 optionally includes logic circuitry configured to apply a correction voltage from the reservoir capacitors to the bit capacitors of the first DAC circuit independently from applying the correction voltage from the reservoir capacitors to the bit capacitors of the second DAC circuit. Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced.

These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An analog-to-digital converter (ADC) circuit comprising:
    a first digital-to-analog (DAC) circuit and a second DAC circuit, wherein the first and second DAC circuits include weighted bit capacitors and reservoir capacitors, wherein a differential input voltage is applied to the weighted bit capacitors and a reference voltage is applied to the reservoir capacitors with respect to a reference common mode;
    a first comparator circuit operatively coupled to the first and second DAC circuit to receive a comparator differential input voltage, wherein the first comparator circuit has a comparator common mode offset and the comparator differential input voltage has an input common mode offset; and
    logic circuitry coupled to the first and second DAC circuits, and the first comparator circuit, the logic circuitry configured to:
    initiate successive bit trials of the weighted bit capacitors to convert the input voltage to a digital value; and
    selectively add or subtract charge of a reservoir capacitor to a corresponding weighted bit capacitor according to a polarity of residue voltage of the weighted bit capacitor resulting from a bit trial performed as a voltage conversion progresses to reduce the comparator differential input voltage and reduce an error between the input common mode offset and the comparator common mode offset.

2. The apparatus of claim 1, wherein the logic circuitry is configured to initiate a comparison using the output of the first DAC circuit, the output of the second DAC circuit, and a common mode voltage of the first comparator circuit; and apply charge of a reservoir capacitor to a weighted bit capacitor based upon the one or more of the bit trials according to the comparison.

3. The apparatus of claim 2, including a first auxiliary ADC circuit configured to convert a voltage referenced from an input of the first DAC circuit to the comparator common mode, and a second auxiliary ADC circuit configured to convert a voltage referenced from an input of the second DAC circuit to the comparator common mode;

wherein the logic circuitry is configured to apply charge of a first reservoir capacitor array of the first DAC circuit to a first bit capacitor array of the first DAC circuit according to an output of the first auxiliary ADC, and apply charge of a second reservoir capacitor array of the second DAC circuit to a second bit capacitor array of the second DAC circuit according to an output of the second auxiliary ADC, wherein the first and second auxiliary ADCs include flash ADCs.

4. The apparatus of claim 2, including a second comparator circuit configured to receive an input voltage from the first DAC circuit and the comparator common mode voltage, and a third comparator circuit configured to receive an input voltage from the second DAC circuit and the comparator common mode voltage;

wherein the logic circuitry is configured to apply charge of a first reservoir capacitor array of the first DAC circuit to a first bit capacitor array of the first DAC and apply charge of a second reservoir capacitor array of the second DAC circuit to a second bit capacitor array of the second DAC circuit according to output of the second and third comparator circuits.

5. The apparatus of claim 2, wherein the first and second DAC circuits are N-bit DAC circuits, N being a positive integer, and wherein the logic circuitry is configured to initiate the comparison using the output of the first DAC circuit, the output of the second DAC circuit, and a common mode voltage of the first comparator circuit based upon bit trials for k most significant bits (MSBs) of the N-bit DAC circuits, k being a positive integer greater than zero and less than N, and applying the correction voltage to the k MSBs according to the comparison.

6. The apparatus of claim 2, wherein the logic circuitry is configured to modify charge of a weighted bit capacitor of the first DAC circuit using a corresponding weighted reservoir capacitor of the first DAC circuit according to the comparison, and independently modify charge of a weighted bit capacitor of the second DAC circuit using a corresponding weighted reservoir capacitor of the second DAC circuit according to the comparison.

7. The apparatus of claim 2, including switching circuitry operatively coupled to the reservoir capacitor and the weighted bit capacitor, and configured to apply one of the charge of the reservoir capacitor or an inverse of the charge of the reservoir capacitor to the weighted bit capacitor based upon the one or more of the bit trials according to the comparison.

8. The apparatus of claim 2, wherein the logic circuitry is configured to:

apply a positive voltage from a reservoir capacitor of the first DAC circuit to a corresponding weighted bit capacitor of the first DAC circuit and a positive voltage from a reservoir capacitor of the second DAC circuit to a corresponding weighted bit capacitor of the second DAC circuit when the comparison indicates that the outputs of both the first and second DAC circuits are less than the comparator common mode; and apply a negative voltage from the reservoir capacitor of the first DAC circuit to the corresponding weighted bit capacitor of the first DAC circuit and a negative voltage from the reservoir capacitor of the second DAC circuit to the corresponding weighted bit capacitor of the second DAC circuit when the comparison indicates that the outputs of both the first and second DAC circuits are greater than the comparator common mode.

9. The apparatus of claim 2, wherein the logic circuitry is configured to:

apply a positive voltage from a reservoir capacitor of the first DAC circuit to a corresponding weighted bit capacitor of the first DAC circuit and a negative voltage from a reservoir capacitor of the second DAC circuit to a corresponding weighted bit capacitor of the second DAC circuit when the comparison indicates that the output of the first DAC circuit is greater than the comparator common mode voltage and the output of the second DAC circuit is less than the comparator common mode; and apply a negative voltage from the reservoir capacitor of the first DAC circuit to the corresponding weighted bit capacitor of the first DAC circuit and a positive voltage from the reservoir capacitor of the second DAC circuit to the corresponding weighted bit capacitor of the second DAC circuit when the comparison indicates that the output of the first DAC circuit is less than the comparator common mode voltage and the output of the second DAC circuit is greater than the comparator common mode.

10. The apparatus of claim 1, wherein the logic circuitry is configured to perform bit trials for the first DAC circuit and the second DAC circuit independently to simultaneously converge the comparator differential input voltage to zero and converge a difference between the input common mode offset and the comparator common mode offset to zero.

11. A method of operating an analog to digital converter (ADC) circuit, the method comprising:

receiving an input voltage differentially onto weighted bit capacitors of a first digital-to-analog converter (DAC) circuit of the ADC and a second DAC circuit of the ADC circuit;

applying a differential input voltage from the first and second DAC circuits to a first comparator circuit, wherein the first comparator circuit has a comparator common mode offset and the differential input voltage has an input common mode offset;

applying a reference voltage, with respect to a reference common mode, onto weighted reservoir capacitors of the first DAC circuit and the second DAC circuit;

converting the input voltage to a digital value using multiple bit trials of the weighted bit capacitors; and selectively adding or subtracting charge of one or more weighted reservoir capacitors to one or more weighted bit capacitors, according to polarity of a residue voltage of the one or more weighted bit capacitors, as a voltage conversion progresses to reduce the comparator differential input voltage and reduce an error between the input common mode offset and the comparator common mode offset.

12. The method of claim 11, wherein selectively adding or subtracting charge of one or more reservoir capacitors to one or more bit capacitors includes comparing the output of the first DAC circuit, the output of the second DAC circuit, and a common mode voltage of the first comparator circuit, and applying the correction voltage from a reservoir capacitor to a weighted bit capacitor according to the comparison.

13. The method of claim 12,
wherein the receiving the input voltage includes sampling the input voltage differentially from an input of the first DAC circuit to an input of the second DAC circuit;
wherein the method further includes applying the input of the first DAC circuit to a first auxiliary ADC circuit, and applying the input of the second DAC circuit to a second auxiliary ADC circuit,
wherein the comparing the outputs of the first and second DAC circuit and the common mode voltage includes comparing the output of the first auxiliary ADC circuit, the output of the second auxiliary ADC circuit, and the common mode voltage of the first comparator circuit; and
wherein the applying the correction voltage includes applying charge from a first reservoir capacitor array of the first DAC circuit to a first bit capacitor array of the first DAC circuit according to the comparison, and applying charge from a second reservoir capacitor array of the second DAC circuit to a second bit capacitor array of the second DAC circuit according to the comparison.

14. The method of claim 12,
wherein the comparing the outputs of the first and second DAC circuit and the common mode voltage includes comparing an output of the first DAC to the common mode offset using a second comparator circuit and comparing an output of the second DAC circuit to the common mode offset using a third comparator circuit, and
applying charge from a first reservoir capacitor array of the first DAC circuit to a first bit capacitor array of the first DAC circuit and applying charge from a second reservoir capacitor array of the second DAC circuit to a second bit capacitor array of the second DAC circuit according to outputs of the second and third comparator circuits.

15. The method of claim 12, wherein the first and second DAC circuits are N-bit DAC circuits, N being a positive integer greater than one, and wherein applying the correction voltage includes comparing the output of the first DAC circuit, the output of the second DAC circuit, and the common mode voltage of the first comparator circuit based upon bit trials k most significant bits (MSBs) of the N-bit DAC circuits, k being a positive integer less than N, and applying the correction voltage to the k MSBs according to the comparison.

16. The method of claim 12, including modifying charge stored on a weighted bit capacitor of the first DAC circuit using a corresponding weighted reservoir capacitor of the first DAC circuit according to the comparison, and independently modifying charge stored on a weighted bit capacitor of the second DAC circuit to a corresponding weighted reservoir capacitor of the second DAC circuit according to the comparison.

17. The method of claim 11, including operating the first DAC circuit and the second DAC circuit independently to simultaneously converge the comparator differential input voltage to zero and converge the input common-mode offset to the comparator common mode offset.

18. A differential successive approximation routine analog-to-digital converter (SAR ADC) circuit comprising:
a first digital-to-analog circuit (DAC) circuit and a second DAC circuit, wherein the first and second DAC circuits include weighted bit capacitors configured to store a differential input voltage and reservoir capacitors to store a differential reference voltage;
a comparator circuit configured to compare outputs of the first and second DAC circuits; and
logic circuitry configured to:
reduce a differential voltage residue between outputs of the first DAC circuit and second DAC circuit when an input common mode voltage is intermediate an output voltage of the first DAC circuit and an output voltage of the second DAC circuit; and
selectively add or subtract charge of the reservoir capacitors to charge of the bit capacitors according to polarity of a common mode voltage residue between the outputs of the first and second DAC circuits during a voltage conversion to reduce a difference between the common mode voltage residue and a common mode voltage of the comparator when the input common mode voltage is greater than or less than both the output voltage of the first DAC circuit and the output voltage of the second DAC circuit.

19. The SAR ADC circuit of claim 18, wherein the first and second DAC circuits are N-bit DAC circuits, wherein N is a positive integer, and wherein the logic circuitry is configured to selectively add or subtract the charge of the reservoir capacitors to the charge of the bit capacitors according to the polarity of the common mode voltage reside for only the k most significant bits (MSBs) of the N-bit DAC circuits, wherein k is a positive integer greater than zero and less than N.

20. The SAR ADC circuit of claim 18, wherein the logic circuitry is configured to apply a correction voltage from the reservoir capacitors to the bit capacitors of the first DAC circuit independently from applying the correction voltage from the reservoir capacitors to the bit capacitors of the second. DAC circuit.

* * * * *

UNITED STATES PATENT AND TRADEMARK OFFICE
CERTIFICATE OF CORRECTION

PATENT NO. : 10,291,249 B2
APPLICATION NO. : 15/213078
DATED : May 14, 2019
INVENTOR(S) : Michael C. W. Coln Page 1 of 1

It is certified that error appears in the above-identified patent and that said Letters Patent is hereby corrected as shown below:

In the Claims

In Column 12, Line 46, in Claim 1, delete "circuit" and insert --circuits-- therefor In Column 14, Line 66, in Claim 12, delete "the" and insert --a-- therefor In Column 15, Line 44, in Claim 15, before "k", insert --for--

In Column 16, Line 40, in Claim 19, delete "reside" and insert --residue-- therefor In Column 16, Line 49, in Claim 20, delete "second." and insert --second-- therefor Signed and Sealed this
Seventh Day of April, 2020

Andrei Iancu
*Director of the United States Patent and Trademark Office*